United States Patent [19]

Gross

[11] 4,066,927

[45] Jan. 3, 1978

[54] WIDE-BAND LOW-REFLECTION ATTENUATED DELAY LINE

[75] Inventor: Franz Gross, Munich, Germany

[73] Assignee: Siemens Aktiengesellschaft, Berlin & Munich, Germany

[21] Appl. No.: 693,840

[22] Filed: June 8, 1976

[30] Foreign Application Priority Data

June 10, 1975 Germany ............................ 2525845

[51] Int. Cl.[2] ........................ H01P 1/22; H01J 25/34; H03F 3/58

[52] U.S. Cl. ....................................... 315/3.5; 315/3.6; 330/43; 333/31 A; 333/81 B

[58] Field of Search ........................... 333/31 A, 81 B; 315/3.5, 39.3, 3.6; 330/43

[56] References Cited

U.S. PATENT DOCUMENTS

| | | | |
|---|---|---|---|
| 3,153,767 | 10/1964 | Kyhl | 315/3.5 |
| 3,602,766 | 8/1971 | Grant | 315/3.5 |
| 3,771,010 | 11/1973 | Winslow | 315/39.3 X |
| 3,886,397 | 5/1975 | Hiramatsu | 315/3.6 |

*Primary Examiner*—Alfred E. Smith
*Assistant Examiner*—Marvin Nussbaum
*Attorney, Agent, or Firm*—Hill, Gross, Simpson, Van Santen, Steadman, Chiara & Simpson

[57] ABSTRACT

A delay line for traveling-wave tubes, particularly a wideband low-reflection attenuated line for millimeter waves, in the form of a hollow guide having successive transverse walls which define successive line cells, each of such walls having a central opening for the passage of the electron beam and at least one coupling opening, elongated attentuating members being disposed in the respective cells with their longitudinal axes extending parallel to the longitudinal axis of the delay line. The attenuating members are of like effective length and the matching cell lying immediately ahead of and/or behind the attenuating section of the tube contains, in each case, at least one matching member.

12 Claims, 2 Drawing Figures

WIDE-BAND LOW-REFLECTION ATTENUATED DELAY LINE

BACKGROUND OF THE INVENTION

The invention relates to a wide-band low-reflection attenuated delay line for traveling wave tubes, particularly for the amplification of millimeter waves, comprising a hollow guide provided with successive transverse walls defining line cells, each of which walls are provided with a central opening for the passage of the electron beam and, in addition, at least one coupling opening therein. Disposed in the individual line cells and having their longitudinal axes extending approximately parallel to the longitudinal axis of the delay line are respective elongated attenuating bodies. A delay line of this general construction is known from German Pat. No. 2,347,209.

In the achievement of an effective attenuation arrangement in connection with extremely high working frequencies, for example, in the mm wave range, considerable technological difficulties arise. The attenuation elements must be so formed, disposed and mounted that they develop a high specific attenuation effect while only slightly reflecting over the whole operating band, and, at the same time, must additionally provide sufficient dissipation of the heat losses arising during operation. The desired matching of the attenuation course proves to be especially critical. As a rule, in this connection, the attenuation effect of successive line cells heretofor was altered stepwise in accordance with a specific function which must be precisely maintained. Such a tapering of the attenuation requires an exact measurement and careful positioning of the individual, variously sized attenuation bodies or members. If such tapering is achieved by variation in the length of solid cylinders (See German Pat. No. 2,347,209) instead of, for example, by separation of variously sized sections along the cylinder generatrix, or for example, by the use of attenuating wedges, unquestionably, a decrease can be achieved in the production expense. However, accurate reproduction of the desired effective matching values from tube to tube is not easily achieved, which becomes of particular importance in series production and subsequent tube replacements.

BRIEF SUMMARY OF THE INVENTION

By means of the invention, a delay line with a wide-band low-reflection matched attenuation, whose attenuation and matching values can be maintained within narrow limits, and which at the same time is relatively simple in contruction and requires no particular production outlay, is achieved by a construction in which practically all attenuation bodies have an equally great penetration depth into the line cells and that for matching the attenuation line cells, forming an attenuating section or stage, to the remainder of the delay line, the line cell lying ahead of and/or behind the attenuating stage, i.e., matching cell, contains at least one matching body. The attenuating bodies normally will have a cylindrical configuration, i.e., in the form of an attenuating cylinder.

The concept of attenuating a delay line in the manner of the invention represents a radical departure from the tapering type of attenuation stage which has heretofore always been provided, frequently varied, but basically deemed necessary.

Instead of gradually increasing the attenuation effect, in accordance with the invention, the attenuating cells are matched by a suitable adjustment of matching cylinders or pins in the respective immediately adjacent line cells. A delay line constructed in this manner can be readily manufactured and relatively conveniently assembled and, as identically constructed attenuation bodies or pins are employed, adjustment can be readily effected to achieve a matching of the attenuating stage, which matching varies only slightly around predetermined median values. In addition, good reproducibility is achieved, as the pins can individually be so graduated that they aid in compensating for the reflection spots or points, never completely avoidable, (for example, mechanical defects or soldering defects) which are particularly disturbing in the vicinity of the attenuation stage.

Test measurements have demonstrated that the achievable matching values are surprisingly favorable. In comparisons with a damping wedge arrangement, employed with an otherwise identical line, it has been demonstrated that, at an identical attenuation output, the reflection factor was somewhat less over an approximately identical band-width. This result is all the more noteworthy in that it is achieved with an especially short attenuation stage, and with all attenuation cells have an equally large attenuating effect which is especially high when several attenuating bodies are employed per cell. In addition, the delay line according to the invention has the same advantageous characteristics as a line constructed in accordance with the previously referred to patent, and in particular, has excellent heat transfer characteristics.

It is already known from U.S. Pat. No. 3,602,766 to have attenuating cylinders protruding, with identical penetration depth, into successive line cells. However, in this previously known arrangement, there is involved a frequency-selective attenuation of band edge oscillations which, as is well known, must meet other conditions than an operating band attenuation and, in particular, does not require comparable matching measures.

On the other hand, it has already been suggested (U.S. Pat. No. 3,538,377) to introduce reflection elements into the delay line in an effort to smooth the amplification characteristics. In a sample embodiment of this construction, there is a discontinuity at the same level with a resistance-loaded closure at the electron gun end of a line section. A line design of this type has nothing in common with the line construction here involved.

In order to keep the spread of the matching values particularly small, it is recommended that the ends of the individual attenuating bodies, i.e., cylinders or pins, in each case, do not touch the transverse wall adjacent thereto, and that when adjacent attenuating bodies oppose one another, a finite distance be maintained between the opposing ends.

For the same reason, the attenuating cylinders should be formed of ceramic material and be coated with a layer of lossy material of a specific surface resistance. However, it would also be possible to employ, in lieu thereof, metal-ceramic attenuating material with high electric or magnetic cell-attenuating, particularly tungsten aluminum oxide.

Ceramic material or metal is preferable for the matching pins. Metal pins have the advantage that the matching cannot be disturbed by vapor deposition or the like caused, for example, by electron impaction on the transverse walls.

Particularly favorable results can be achieved with a delay line in which the individual line cells are further subdivided, for example, for a steepening of the dispersion curve. (For a line of this type, see German Pat. No. 1,804,959). If in this arrangement, the attenuating bodies are mounted in the transverse subdividing walls, i.e., aperture walls, only the heat loss, i.e., heat due to energy losses produced during the attenuation must be dissipated, i.e., carried away, since the aperture walls are not impacted by the beam electrons. Thus, for example, by the utilization of four attenuating cylinders for each line cell, the attenuation stage can be very short in length and by individual variation of the matching pins, good reflection values can also be achieved with a line structure of this type.

If the delay line consists of a single section or stage, the attenuating section should be terminated at both ends by matching cells. Likewise, if the line contains several sections separated from one another in a high frequency manner by means of severs, and the attenuation sections end immediately at the severs, a single matching cell at the end of the attenuation section facing away from the sever will be satisfactory.

BRIEF DESCRIPTION OF THE DRAWING

In the drawing wherein like reference characters indicate like or corresponding parts.

DETAILED DESCRIPTION OF THE INVENTION

Figure 1:
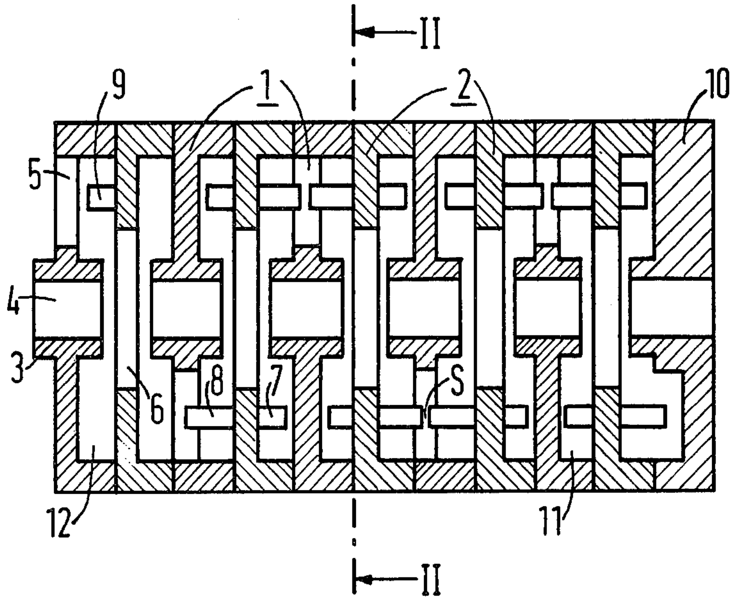
FIG. 1 is a longitudinal section of a delay line embodying the invention.

The delay line involved is adapted to be employed in a traveling wave tube for amplifying millimeter waves and comprises several sections, separated from one another in a high-frequency manner, only one of which sections is illustrated in FIG. 1, more particularly, only the portion thereof comprising the attenuation section or stage. As will be apparent from a reference to FIG. 1, the section comprises a plurality of transverse walls and a plurality of intermediate transverse aperture walls 2 with the walls 1 and aperture walls 2 alternately disposed in abutting relation, and the line terminated by a sever 10. Both the transverse walls 1 and the aperture walls 2 are provided with similar corresponding longitudinally extending flanges of circular configuration which form the exterior wall of the section and, at the same time, function as spacers for the respective walls without requiring additional spacing elements. The respective components are constructed of copper, soldered together to form an integrally connected stacked structure. Each transverse wall contains a relatively small, centrally disposed beam-tube 3 containing a longitudinally extending beam opening or passageway 4. Each transverse wall also contains a coupling opening 5, while the transverse aperture walls each contain a relatively large central opening 6. As will be apparent from a reference to FIG. 1, the coupling openings of the successive transverse walls 1 are each offset by 180° with respect to the coupling openings of the adjacent transverse walls, with each adjacent pair of transverse walls 1 defining one line cell 11, each of which is subdivided by a transverse aperture wall 2. With such shunt loadings, the stacked line construction described has steep dispersion branches in its longest wave pass region with backward-running fundamental wave, and is operated in the first (forward-running) space harmonic.

Figure 2:
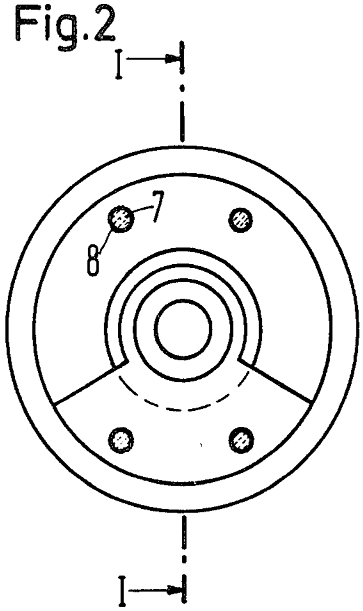
FIG. 2 is a transverse section taken approximately on the line II—II of FIG. 1.

As will be apparent from a reference to FIG. 2, the transverse aperture walls 2 each contain four recesses, which, in the construction illustrated, are in the form of bores or holes extending through the walls, with each having disposed therein a respective attenuation cylinder or pin 8, provided with a suitable resistance layer 7, i.e., a carbon layer. All of the attenuating cylinders have like cross sections, are of the same length, and do not touch the adjacent transverse walls. Where two such cylinders are in end to end opposition, they are provided with a specific interval or space S. In the present instance, $Al_2O_3$ is employed as the cylinder material. However, boron nitride can also be employed, or where higher thermal loadings are involved, berylium oxide.

In the line cell, i.e., matching cells 12, disposed immediately ahead of the attenuation section, two ceramic matching pins 9 are disposed, in this case, in recesses or blind bores, although through bores could be employed in the first attenuation section transverse wall.

The attenuating cylinders are pressed into the openings in the aperture walls by means of a tube-shaped device whereby a firm seating and thereby a good heat contact of the cylinder to the copper wall of the aperture wall is obtained whereby the loss energy is dissipated over an extremely short route, if necessary, by a cooled outer wall.

Matching of the attenuation section is effected by adjustments of the matching pins driving assembly of the line elements, prior to soldering. The subsequent soldering has no effect on the measured values as the structure does not shift in the assembly process.

In a delay line constructed in accordance with the invention, an attentuation of up to 6 db was achieved per attenuation cell and with an existing power loss of 100 W, no impairments were experienced as well as no disintegration whatsoever of the attenuation cylinders.

It will be apparent to those skilled in the art that many modifications and variations may be effected without departing from the spirit and scope of the novel concepts of the present invention.

I claim as my invention:

1. In a wide-band, low-reflection attenuated delay line for traveling wave tubes, particularly for the amplification of millimeter waves, the combination of a hollow guide forming an attenuation section having transverse walls defining respective line cells therebetween, which walls each having a central opening for the passage of the electron beam and at least one coupling slot, elongated attenuating members disposed in the respective cells with their longitudinal axes extending at least approximately parallel to the longitudinal axis of the delay line, said attenuating members having a substantially uniform effective penetration depth within the associated cells, and a line cell, forming a matching cell, disposed directly ahead of and/or behind the attenuation section for matching the latter to an adjacent section of the delay line, said matching cell, in each case, containing at least one matching member therein.

2. A delay line according to claim 1, wherein the ends of the attenuating members, where opposed to a transverse wall, are spaced from such wall, and, where opposed to a like end of an adjacent attenuating member, are spaced a predetermined distance apart.

3. A delay line according to claim 1, wherein the attenuating members are formed from a ceramic material uniformly coated with a layer of lossy material.

4. A delay line according to claim 1, wherein the matching members are formed from a ceramic or metal material.

5. A delay line according to claim 1, wherein each attenuating cell contains a plurality of attenuating members.

6. A delay line according to claim 1, wherein the attenuating members are secured to associated wall means by a press fit, whereby the attenuating members preferably have a lesser diameter where surrounded by the associated supporting wall.

7. A delay line according to claim 1, wherein respective apertured walls are provided, each of which subdivides a respective line cell, said attenuating members being supported by the corresponding associated aperture wall.

8. A delay line according to claim 7, wherein the ends of the attenuating members, where opposed to a transverse wall, are spaced from such wall, and, where opposed to a like end of an adjacent attenuating member, are spaced a predetermined distance apart.

9. A delay line according to claim 8, wherein the attenuating members are formed from a ceramic material uniformly coated with a layer of lossy material.

10. A delay line according to claim 9, wherein the matching members are formed from a ceramic or metal material.

11. A delay line according to claim 10, wherein each attenuating cell contains a plurality of attenuating members.

12. A delay line according to claim 11, wherein the attenuating members are secured to associated wall means by a press fit, whereby the attenuating members preferably have a lesser diameter where surrounded by the associated supporting wall.

* * * * *